(12) United States Patent
Nagelmüller et al.

(10) Patent No.: US 12,030,729 B2
(45) Date of Patent: Jul. 9, 2024

(54) HOLDING AND EXCHANGING DEVICE AND METHOD FOR POWER MODULES

(71) Applicant: Miba Energy Holding GmbH, Laakirchen (AT)

(72) Inventors: Martin Nagelmüller, Edt bei Lambach (AT); Ratzi Raimund, Wels (AT)

(73) Assignee: Miba Energy Holding GmbH, Laakirchen (AT)

( * ) Notice: Subject to any disclaimer, the term of this patent is extended or adjusted under 35 U.S.C. 154(b) by 829 days.

(21) Appl. No.: 17/058,115

(22) PCT Filed: May 23, 2019

(86) PCT No.: PCT/AT2019/060171
§ 371 (c)(1),
(2) Date: Nov. 23, 2020

(87) PCT Pub. No.: WO2019/222780
PCT Pub. Date: Nov. 28, 2019

(65) Prior Publication Data
US 2021/0198052 A1 Jul. 1, 2021

(30) Foreign Application Priority Data
May 25, 2018 (AT) .............................. A 50429/2018

(51) Int. Cl.
*H05K 7/14* (2006.01)
*B65G 47/90* (2006.01)
*H02M 7/00* (2006.01)

(52) U.S. Cl.
CPC ............ *B65G 47/90* (2013.01); *H02M 7/003* (2013.01); *H05K 7/14* (2013.01)

(58) Field of Classification Search
CPC ....... H05K 7/14; H05K 5/0017; H05K 5/0217
(Continued)

(56) References Cited

U.S. PATENT DOCUMENTS 8,472,200 B2   6/2013   Sofker et al.
10,038,311 B2  7/2018   Kim et al.
(Continued)

FOREIGN PATENT DOCUMENTS

CN   102467172 A   5/2012
CN   106452105 A   2/2017
(Continued)

*Primary Examiner* — Hung S. Bui
(74) *Attorney, Agent, or Firm* — Stoel Rives LLP (57) ABSTRACT

The invention relates to a method and a modular holding and exchanging system (1) for medium or high voltage converters, preferably a modular multilevel converter, comprising a rack (2) for receiving at least two power modules (3) arranged on top of one another in receiving spaces (4), wherein the rack (2) has at least two pairs of vertical standing elements (5) and at least two carrier elements (6) connecting the vertical standing elements (5) in a longitudinal direction (10) of the rack (2) in a horizontal support plane (9), a lifting tool (7) that can be coupled with the rack (2), which lifting tool (7) comprises at least one, preferably at least two, rolling bodies (19) that can be adjusted between a rest position (13) and a support and/or service position (14) for temporarily raising and/or moving a power module (4), wherein the power modules (4) have support surfaces (16) projecting in a transverse direction (11) with respect to a housing width (15) for being supported on the carrier elements (6), and the carrier elements (6) have an upper side (17) provided for at least parts of the support surface (16) of the respective power module (4) to rest on, and are configured as a profile element such that every carrier element (6) has at least one, preferably at least two passages (18), each, that are spaced apart from one another in the longitudinal direction (10), for at least one rolling body (19) to pass through in the service position (14) of the lifting tool (7), and wherein the lifting tool (7) comprises a longitudinally extended profile body (21), preferably a hollow body, con- (Continued)

figured so as to be insertable into the profile element of the carrier element (6) in the rest position (13), in which profile body (21) a lever device (20) is formed for adjusting the at least one rolling body (19), preferably of the at least two rolling bodies (19), which are spaced apart from one another in the longitudinal direction (10), from the rest position (13) into the service position (14).

20 Claims, 6 Drawing Sheets

(58) Field of Classification Search
USPC .................. 361/731, 728, 807, 809, 810
See application file for complete search history.

(56) References Cited

U.S. PATENT DOCUMENTS

| | | |
|---|---|---|
| 10,079,479 B2 | 9/2018 | Kim et al. |
| 10,905,026 B2 * | 1/2021 | Franklin ............ A47B 87/0276 |
| 2012/0080391 A1 | 4/2012 | Nakamura et al. |
| 2012/0155034 A1 | 6/2012 | Hsiao |

FOREIGN PATENT DOCUMENTS

| | | |
|---|---|---|
| DE | 1209626 B | 1/1966 |
| DE | 102007041406 A1 | 3/2009 |
| EP | 1471781 A1 | 10/2004 |
| EP | 2248758 A2 | 4/2010 |
| EP | 3091621 A1 | 11/2016 |
| EP | 3179589 A1 | 6/2017 |
| TW | 428878 U | 4/2001 |
| WO | 2004082348 A2 | 9/2004 |
| WO | 2016009046 A1 | 1/2016 |

* cited by examiner

HOLDING AND EXCHANGING DEVICE AND METHOD FOR POWER MODULES

RELATED APPLICATIONS

This application is a national stage under 35 U.S.C. § 371 of International Application No. PCT/AT2019/060171, filed May 23, 2019, which claims priority of Austrian Patent Application No. A50429/2018, filed May 25, 2018.

OVERVIEW

The present disclosure relates to a modular holding and exchanging system as well as a method for changing a power module of a medium or high voltage converter.

High-voltage direct-current transmission is the conversion of a three-phase current into direct current, or vice versa. In this process, inverters (or modular multilevel converters, MMC) are often used. Such modular multilevel converters usually consist of a plurality of series-connected power modules, which can also be referred to as submodules. Each power module can be actuated independently of the other power modules. The power modules subjected to the medium or high voltage generally have a relatively high weight of more than 200 kg. The arrangement of the power modules often takes place in a frame and/or rack, wherein a low construction volume as well as minimizing the cost and ensuring the insulation requirements are to be taken into account by the person skilled in the art.

In order to ensure the proper functioning of the medium or high voltage converter, it is necessary that faulty power modules can be replaced quickly and safely. Due to the high weight of the power modules, changing them is often very difficult to do. A series of changing devices for changing power modules are known to the person skilled in the art. EP 3 091 621 A1 is mentioned here in a representative manner, which discloses a changing device for power modules, wherein a longitudinally extended, fixed receiving frame and a holding frame horizontally displaceable thereon, for receiving a power module, is described. Upper, lateral and lower walls of the receiving frame form a roller channel that is open to one side, into which the displaceable retaining frame with the rollers can be inserted for the use of the power module. The changing device disclosed in EP 3 091 621 A1 is therefore constructed as an extendible carriage, whereby a high additional weight of the changing device is added for each power module and/or receiving space of the modular multilevel converter. Moreover, the configuration of the changing device as a multi-part carriage system necessitates a relatively high total space requirement.

A further possibility for a changing device is disclosed in WO 2016/009046 A1. In this document, the power modules are supported by means of L-shaped rails, affixed to the underside, relative to horizontal reinforcement struts. The changing device of WO 2016/009046 A1 is inserted, as a ball bearing platform, into the intermediate space formed by the L-shaped pillars between the retaining frame of the rack and the underside of the power module. This makes it possible to push out and replace the power module after the contacting and lifting of the power module by the ball bearing platform. Such a ball bearing platform, however, has the disadvantage of a very high weight and can therefore be used by one individual operator only under great effort. Moreover, the required space of a power module and/or a receiving space is relatively high in the vertical direction due to the formation of the L-shaped pillars.

WO 2004/082348 A2 discloses a control cabinet with an electrical device or module operated therein and built into an extended and/or oblong, approximately cuboidal housing, for an electromotive single drive.

DE 12 09 626 B discloses a device for locking inserts of electronic devices in racks and cabinets for electronic communication devices.

US 2012/155034 A1 discloses a server cabinet comprising a frame and multiple guide rails. Each guide rails comprises a connection section and an inclined section. Between said connection section and the inclined section, an acute angle is formed.

It was the object of the present invention was to overcome the disadvantages of the prior art and to provide a modular holding and exchanging system and a method, by means of which a user is capable of performing an easy, safe and quick change of a faulty power module. Further underlying benefits are the creation of a cost-effective, space-saving solution meeting the insulation requirements and/or the explosion prevention requirements for a power module holding and exchanging system. Associated with this is a lifting tool according to the present disclosure, which is configured so as to be compatible with the modular holding and exchanging system and for performing the method.

This object is achieved by means of a modular holding and exchanging system as well as a method according to the claims.

The modular holding and exchanging system according to the present disclosure for medium or high voltage converters comprises a rack and a lifting tool that can be coupled to the rack and at least one power module which is arranged in the rack. The rack is configured for receiving at least two power modules arranged on top of one another in receiving spaces. The rack comprises at least two pairs of vertical standing elements and at least two carrier elements connecting the vertical standing elements in a longitudinal direction of the rack in a horizontal support plane. The lifting tool which can be coupled to the rack comprises, in each case, at least one rolling body, preferably at least two rolling bodies, which can be raised and/or moved between a rest position and a support and/or service position. By means of this raising between the rest and the service position, a raising of the power module takes place, which can subsequently be moved out of the rack in the longitudinal direction. The modular holding and exchanging system is configured for receiving power modules, which have support surfaces projecting relative to a housing width in the transverse direction for support on the carrier elements. In this context, the corresponding carrier elements of the rack are configured for the support of at least parts of the support surface of the corresponding power module with an upper side as a profile element provided therefor such that every carrier element has at least one passage each, preferably at least two passages spaced apart from one another in the longitudinal direction, for the passage of at least one rolling body in each case in the service position of the lifting tool. Here, the lifting tool is configured so as to be insertable, in the rest position, into the profile element of the carrier element and comprises a longitudinally extended profile body, preferably hollow body, in which a lever device for adjusting, in each case, at least one rolling body, preferably two rolling bodies spaced apart from one another in the longitudinal direction, from the rest position into the service position.

This way, the modular holding and exchanging system according to the present disclosure avoids transverse elements on the front side which are facing the operator. This both facilitates the operation of the power modules and improves the accessibility in case of service. In the receiving spaces provided therefor, a plurality of power modules can be arranged within the rack in the vertical direction and located on top of one another, wherein, by the supporting of the power modules on the support surfaces, a reduced space requirement of the receiving spaces in the vertical direction relative to the carrier elements of the rack can be achieved. The construction of the modular holding and exchanging system according to the present disclosure can be realized relatively simply and cost-effectively. Inserting the lifting tools into the profile elements of the carrier element is only necessary in case of damage. This avoids the arrangement of movable and/or loose parts in the rack, which parts could prove disadvantageous particularly in the case of high voltage applications. Additionally, by avoiding known lifting devices and/or roller shutter systems on each individual receiving space of the rack, a reduction of the total weight of the holding and exchanging system occurs. Moreover, only one pair of lifting tools is necessary for servicing a medium or high voltage converter, whereby the cost of purchase does not apply. Furthermore, a very low headroom of the rack can be achieved as the individual power modules can be arranged relatively close to one another in the vertical direction. Here, it is conceivable to configure the profile elements as C- or double-T-profiles for receiving the lifting tools, wherein the passages for the rolling bodies must be provided at the top in the vertical direction, and a suitable support of the lifting tool on the profile element toward the bottom in the vertical direction must be ensured. In the simplest case, a profile element can be realized by a closed hollow profile. In addition to a sufficient rigidity of the hollow profile, a shifting of the lifting tool in the transverse direction can be efficiently prevented in this manner.

In addition to the rack described above, a lifting tool is provided by the method, which lifting tool is inserted into the profile element of the respective carrier element in the rest position. Here, the rolling bodies spaced apart from one another are arranged so as to be substantially hidden inside the profile body of the lifting tool. The lifting tools are inserted into both carrier elements in the longitudinal direction, on which carrier elements the power module to be exchanged is supported. In this process, the insertion takes place until the rolling bodies are oriented in alignment with the passages of the carrier element. After this, the lever device of the lifting tool is actuated for adjusting the rolling bodies from the rest position into the service position, wherein the power module to be exchanged is raised by the rolling bodies contacting on at least parts of the support surfaces projecting in the transverse direction relative to its housing width.

In the manner described here, the power module is deflected by a few millimeters to centimeters in the vertical direction over the support plane. After raising the power module to be exchanged, a horizontal moving out, by means of pushing out or pulling out, of the power module in the longitudinal direction onto a transfer device can take place. For a fast restarting, the defective power module can be replaced by an intact power module, or the defective power module can be repaired and subsequently pushed back in. Advantageously, the lifting tool remains in the carrier element during the power module change and can be removed again following the completed change and the lowering of the power module into the rest position at the intended position.

Furthermore, it can be useful if the lever device comprises a push rod connected to all rolling bodies arranged in the longitudinal direction via one lever arm each, so as to be movable with respect to the profile body, for the simultaneous adjustment from the rest into the service position.

Such a lever device is simple to produce and allows a simultaneous actuation of any and all rolling bodies of a lifting tool. Thereby, a homogeneous raising of the power module in the vertical direction takes place, whereby a tilting of the power module to the side can be efficiently avoided.

Furthermore, it can be provided that the lever device is configured so as to be actuatable from a front side of the lifting tool, in the longitudinal direction, preferably by means of an extension.

A plurality of embodiments is conceivable for actuating the lever device or the push rod. For example, the rolling bodies can be raised into the service position separately and/or jointly by means of an electromechanic drive. However, it has proven particularly robust and safe to make the lever device accessible from the front side of the lifting tool, wherein the lever device is to be actuatable by means of pressure in the longitudinal direction. This allows to avoid a complicated mechanical system and to achieve a low weight of the lifting tool. Preferably, the pressure is applied to the lever device in the longitudinal direction by means of an extension.

Moreover, it can be provided that the lifting tool has a locking device for temporarily blocking the push rod in the service position by engaging with a recess on the push rod.

This measure represents a simple, safe and cost-effective possibility for fixing the rolling bodies in the service position. Moreover, blocking the push rod by means of the locking device can be easily performed by the operator and increases the safety when changing the power module.

A design is also advantageous, according to which it can be provided that the locking device has a spring element for applying a prestressing force between profile body and push rod for automatically locking when the lever device is adjusted out of the rest position and into the service position. Alternatively to this, the automatic locking can be achieved by the locking device being mounted in the profile body such that a gravity-induced locking with the profile body into the recess takes place upon adjustment of the lever device from the rest position into the service position.

By this measure, an automatic locking of the rolling bodies in the service position is caused, whereby separate hand movements of an operator can be avoided. Additionally, this measure is very time-saving and can significantly improve the safety of use.

It is particularly advantageous if two lifting tools for raising the power module from the rest position into the service position are actuated simultaneously.

In this manner, a tilting of the power module can be avoided, benefiting safety. Furthermore, a two-handed operation by the operator is easy to perform. It is also conceivable that the actuation of the lever device can be carried out from outside through a corresponding transfer device. To that effect, it is conceivable that a hoisting platform or also a suitable side-shifter carries out the simultaneous actuation of the two lifting tools.

According to a further development, it is possible that, on the profile body of the lifting tool, at least one guide body is arranged laterally and/or on an underside of the lifting tool. Such guide bodies can be made, for example, from low-friction material and primarily serve for correctly positioning the lifting tool within the carrier element. Such guide bodies therefore serve for a lateral and/or vertical support and can be used for reducing the weight of the lifting tool. By this measure, the profile body of the lifting tool can have a smaller diameter. Moreover, an inadvertent shifting of the lifting tool within the carrier elements is made preventable.

Furthermore, it can be useful if the lifting tool has a lever axle for amplifying the torque of an adjusting force applicable to the lever device in a longitudinal direction by means of a couplable extension.

Such a lever axle can also be understood as a support point for the extension. The lever axle therefore serves as a counter bearing for the extension for applying the adjusting force to the lever device in the longitudinal direction. A couplable extension has the advantage that it can be removed from the lifting tool after the lever device has been adjusted from the rest position into the service position. It is easily conceivable that, due to the transmission by the extension, the force of an operator required to exert the necessary adjusting force in the longitudinal direction can be significantly reduced. Instead of the lever axle, the point of application can, for example, also be formed as a hole or a recess on the profile body, preferably hollow body.

Moreover, it can be provided that, on the lever axle, the extension is connected to the lifting tool so as to be movable.

In certain cases, it has proven advantageous that the extension is affixed to the lifting tool. This avoids an inadvertent dropping of the extension and possible damage to connections of adjacent power modules. Likewise, losing the extension or leaving it inside the medium or high voltage converter can be avoided. Advantageously, the profile body, on the front side, has a clearance in the form of an incline on the front side of the lifting tool, which makes it possible to completely hinge down the extension in the service position, and whereby an obstruction for a corresponding transfer device can be avoided.

Furthermore, it can be provided that the lifting tool has a motorized, preferably an electromotive, drive unit on or inside the profile body for adjusting the push rod in the longitudinal direction.

The advantage of a motorized drive unit is that the adjusting force can be applied easily and comfortably to the push rod in the longitudinal direction while requiring little space. Such a drive unit can be configured to be hydraulic, pneumatic and preferably electric and can transmit the adjusting force via a suitable transmission device such as a spindle, a gear or suchlike and initiate the adjustment of the push rod in a targeted manner. For this purpose, the push rod may be configured to be complementary in shape and/or function. In addition, it is advantageous that such a motorized drive is arranged on the front side of the lifting tool, which allows good accessibility for the operator. Moreover, a motorized drive can be used in addition to a locking device or also by itself if applicable, as the motorized drive, when shut off, can assume a locking function, which increases safety.

Furthermore, it can be provided that at least one horizontally oriented transverse element is arranged in the longitudinal direction, on the back of the rack.

Such a transverse element primarily serves for connecting two carrier elements of a receiving space. In this manner, a frame being open on the front side is formed, which frame increases the rigidity of the rack and significantly facilitates changing the power module, as the rack does not have any obstructing braces on the front side. Preferably, such a frame consisting of one transverse element and two carrier elements is configured as one piece, which can be made possible by an upstream welding process, whereby the installation of the rack can be significantly facilitated. Moreover, the configuration of the open frame as one piece makes a reduction of screw connections possible, offering advantages in the production and installation. The transverse element and/or the one-piece frame can moreover be used as an additional support surface for load transfer of the power module.

According to a particular embodiment, it is possible that at least one carrier element has at least one arresting elevation for securing the power module against shifting in the longitudinal and/or transverse direction, which is formed to be protruding in the vertical direction beyond the support plane for engaging with a corresponding engagement opening on the support surface of the cooling device, and/or at least one arresting elevation on the cooling device is formed to be protruding in the vertical direction beyond the support plane for engaging with a corresponding engagement opening on the carrier element.

Such arresting elevations secure the power module against shifting within the rack, should there be external vibrations as it could happen, for example in the case of an earthquake. An arresting elevation can be configured as an appendage of the carrier element and/or of the cooling device located on the opposite side. Likewise, it is possible that an arresting elevation is formed, for example, by a bolt or also a screw head. The arresting elevations protrude only a few millimeters in the vertical direction relative to the support plane and/or the support surface. When raising the power module into the service position, the power module is deflected via the arresting elevations in the vertical direction. In a reverse arrangement, the arresting elevations are deflected via the carrier elements. This way, a blockage during the service change can be prevented. On the support surface of the cooling device, or in a reversed arrangement on the carrier elements, suitable engagement openings are provided with which the arresting elevations can engage in the rest position. This measure for securing the power module against shifting can be realized simply and cost-effectively.

According to an advantageous further development, it can be provided that the vertical standing elements are made from an electrically non-conducting profile element, in particular a rectangular pipe preferably made of glass-fiber reinforced plastic (GFRP).

By this measure, the individual receiving spaces of the rack are electrically separated. In this context, different profile shapes such as C- or H-profiles can be used as profile elements. Due to the rigidity of a rectangular pipe, this embodiment has proven particularly advantageous.

Particularly being made from a glass-fiber reinforced plastic can realize the necessary electrical properties and combine them with a high degree of rigidity and a low weight. In addition, GFRP is flame-resistant which can increase the safety of the modular holding and exchanging system in case of a short circuit of a power module.

In particular, it can be advantageous if each of the vertical standing elements have a plurality of lateral notches for at least partially receiving the carrier elements and/or the transverse elements.

Such notches can be used for at least partially receiving the carrier elements and/or transverse elements such that a lap joint is formed. The carrier element therefore does not rest on a screw connection but on a part of the cross-section of the profile element. This allows to achieve a particularly good load support and transmission of the carrier elements with respect to the vertical standing elements. Moreover, a space-saving arrangement of the rack is made possible.

Furthermore, it can be provided that, for connecting at least two receiving spaces in the transverse direction, the rack has at least one electrically non-conducting brace, preferably made from GFRP, on the side and/or on the rear side.

By forming such braces, the rigidity of the modular holding and exchanging system and/or of the rack can be increased significantly. The electrically non-conducting material of the brace avoids an electrical connection of the individual receiving spaces.

Furthermore, it can be provided that the rack has one stiffening profile each that is electrically non-conducting, H- or T-shaped, arranged to partially encase the vertical standing elements and preferably made from GFRP between adjacently arranged vertical standing elements.

Such a stiffening profile serves for mechanically connecting racks and/or receiving spaces adjacently arranged in the transverse direction. Moreover, such stiffening profiles can advantageously be used for mounting, for example coolant supply lines or fasteners for signal cables and suchlike without negatively influencing the strength of the vertical standing elements. The partially formed encasing of the vertical standing elements increases the load capacity of the rack in the vertical and/or transverse direction without simultaneously forming an electrical connection of the individual receiving spaces.

Another embodiment is also advantageous, according to which it may be provided that on or inside the transverse element, at least one coupling device for temporarily securing the power module in the rest position is configured such that it has one receiving opening each for receiving a corresponding retaining element in the service position formed, preferably as a pin or a bolt having a groove and/or head, on the rear side of the power module.

The cooperation of the retaining element and the coupling device can be used for ensuring the correct positioning of the positioning groove on the rack. The coupling device can therefore serve as an end stop and/or a centering device.

When moving in the power module, the retaining element in the service position is made to engage with the corresponding receiving opening of the coupling device arranged on or inside the transverse element. This serves for centering and/or arresting the power module. By adjusting the lifting tool into the rest position, the power module is lowered, which arrests the retaining element in the coupling device. In this process, the retaining element is preferably configured as a pin or bolt having a taper or slot or a corresponding head, which, in the service position, meaning in a raised state of the power module, is connected to the coupling device upon insertion into the rack. The pin or bolt preferably has a groove and/or a head that is widened with respect to the pin diameter, which head, upon lowering, is arrested from below by means of the coupling device on at least one side in the vertical direction.

In this manner, a highly efficient securing of the power module against shifting can take place in addition to the centering and/or arresting of the power module in the receiving space of the rack. This simple and cost-effective measure significantly increases the security against inadvertent changes of position in case of an external initiation of vibrations, for example in case of an earthquake.

For making changing the power modules easier, it has proven advantageous if the lifting tool has an insertion stop on its front side in at least a vertical direction and/or transverse direction.

This allows to position the lifting tool quickly and exactly during insertion into the profile element of the carrier element in the rest position, wherein the exact positioning of the rolling body opposite the passages can be carried out quickly and easily.

It has furthermore proven advantageous if the carrier elements have a reference stop on the upper front side in the longitudinal direction.

In addition to the coupling device or also independently, this measure can increase the security against a power module that is not inserted deep enough. In this regard, at least one stop element is advantageously formed on the power module, in the transverse direction with respect to the width of the power module, which stop element correspondingly cooperates with the reference stop upon insertion into the rack. Such a solution can be produced relatively easily, and it ensures that the electrical connections are oriented in a vertical plane on the front side of the modular holding and exchanging system.

According to a further development, it is possible that coolant supply lines are arranged on or inside the vertical standing elements and/or the carrier elements, and that on each receiving space, they have supply connections for connecting to the power module connections of a cooling device of the respective power module.

The coolant supply lines can also be arranged on the stiffening profile. This measure has the advantage that the coolant supply lines as well as all supply connections for connecting the power module connections of the respective power module are very easily accessible for an operator. Moreover, a simple installation and a space-saving arrangement is made possible.

Furthermore, it can be useful if the supply connections and the corresponding power module connections are configured for automatically coupling when lowered into the rest position and/or for decoupling when raised into the service position.

Here, it is advantageous if the supply connections as well as the corresponding power module connections are formed as quick-release fasteners. Preferably, the corresponding connection ends are bent upwards and/or downwards, whereby an automatic coupling of the supply connections with the power module connections takes place when the power module is lowered from the service position into the rest position. This way, the cooling device, in particular a cooling plate, can be coupled to the coolant supply line very safely and quickly. This way, long, suspended hoses of the coolant supply are avoided and are therefore not in the way of a required power module change. Preferably, the fasteners are configured such that, when the power module is raised into the service position, an automatic decoupling takes place. This allows a quick power module change as it is not necessary to depressurize and/or seal the supply and power module connections. Additionally, the security against incorrect operation is increased.

Forming the modular holding and exchanging system according to embodiments of the present disclosure promotes a good accessibility of a transfer device to the rack and/or the individual receiving spaces. Such a transfer device can be configured as a floor-bound lifting means, in particular a hoisting platform or a forklift or a crane device. The transfer device is oriented such that the transfer plane is oriented in a horizontal plane with the service plane. Using the present instruction, a person skilled in the art can select suitable transfer devices and use them according to the method.

BRIEF DESCRIPTION OF THE DRAWINGS

For the purpose of better understanding of the invention, it will be elucidated in more detail by means of the figures below.

These show in a respectively very simplified schematic representation.

DETAILED DESCRIPTION OF PREFERRED EMBODIMENTS

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

Figure 1:
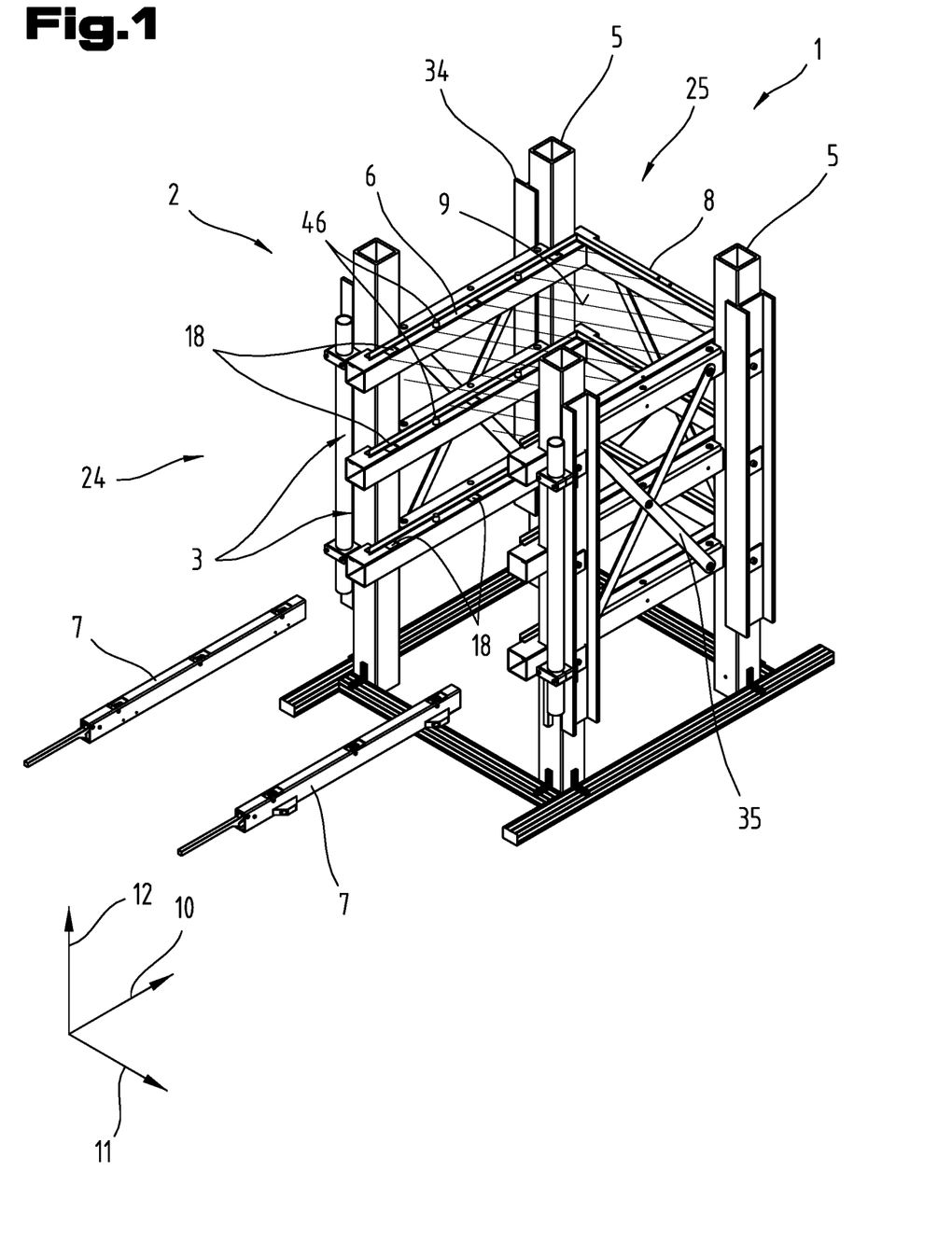
FIG. 1 an oblique view of an exemplary embodiment of a modular holding and exchanging system.

FIG. 1 shows a schematic representation of a modular holding and exchanging system 1 according to an embodiment. In the exemplary representation, the rack 2 has multiple receiving spaces 3 arranged on top of one another. These serve for receiving one power module 4 each, which rest on support surfaces 16 on the carrier elements 6 and therefore, in the rest position 13 come to lie in the horizontal support plane 9. The rack 2 hast at least two pairs of vertical standing elements 5. They are connected in the longitudinal direction 10 in the support plane 9 by carrier elements 6. FIG. 1 also shows transverse elements 8 which connect the carrier elements 6, in each case in the transverse direction 11 on the rear side 25.

Furthermore, FIG. 1 shows two lifting tools 7 configured according to one embodiment. The lifting tools 7 are provided for being inserted into one carrier element 6 each, which is configured as a profile element. The insertion of the lifting tools 7 is carried out from the front side 24.

Figure 2:
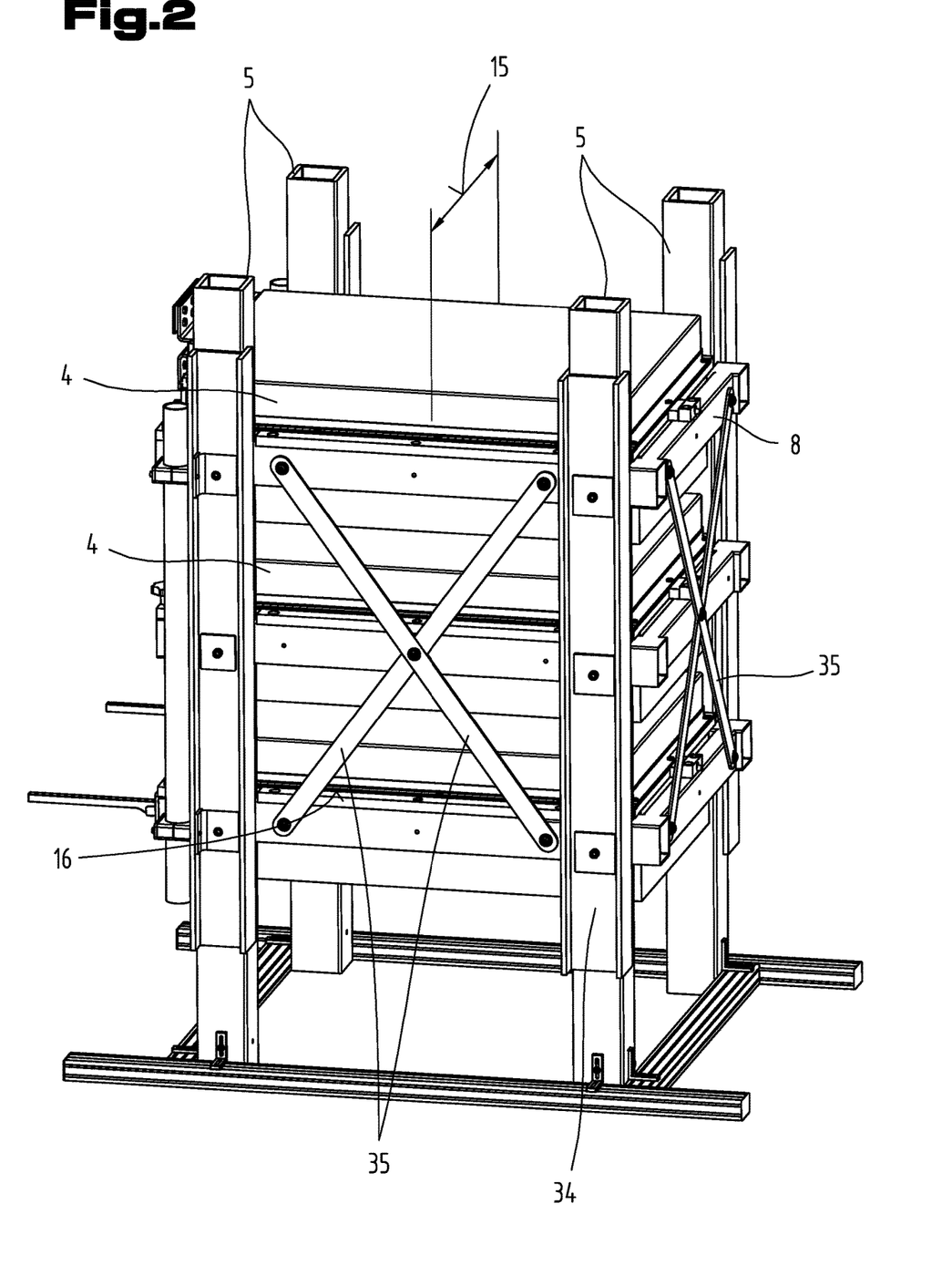
FIG. 2 an oblique view of an exemplary embodiment of a modular holding and exchanging system with three power modules.

FIG. 2 shows a further exemplary arrangement of the modular holding and exchanging system 1 in an oblique view. Here, three power modules 4 can be seen which support themselves on at least the carrier elements 6, using their respective support surfaces 16 protruding laterally with respect to the housing width 15 of the power module. The power modules 4 shown are in the rest position 13. The particularly space-saving arrangement of the power modules 4 in the respective receiving spaces 3 of the rack 2 can be seen very well in this drawing.

Stiffening profiles 34 can be provided for increasing the stability of the rack 2. The stiffening profiles 34 are formed between the vertical standing elements 5 of adjacently arranged receiving spaces 3. In the present example, the stiffening profiles 34 have an H-shaped profile and are screwed with the vertical standing elements 5. The vertical standing elements 5 are received by the stiffening profiles 34 so as to be at least partially encased, which contributes to an increased transverse stiffness. FIG. 2 further shows braces 35 which are provided for mechanically connecting the receiving spaces 3 to one another. Due to the non-conducting configuration of the braces 35, an electrical connection of the individual receiving spaces 3 and/or power modules 4 to one another is avoided.

Figure 3:
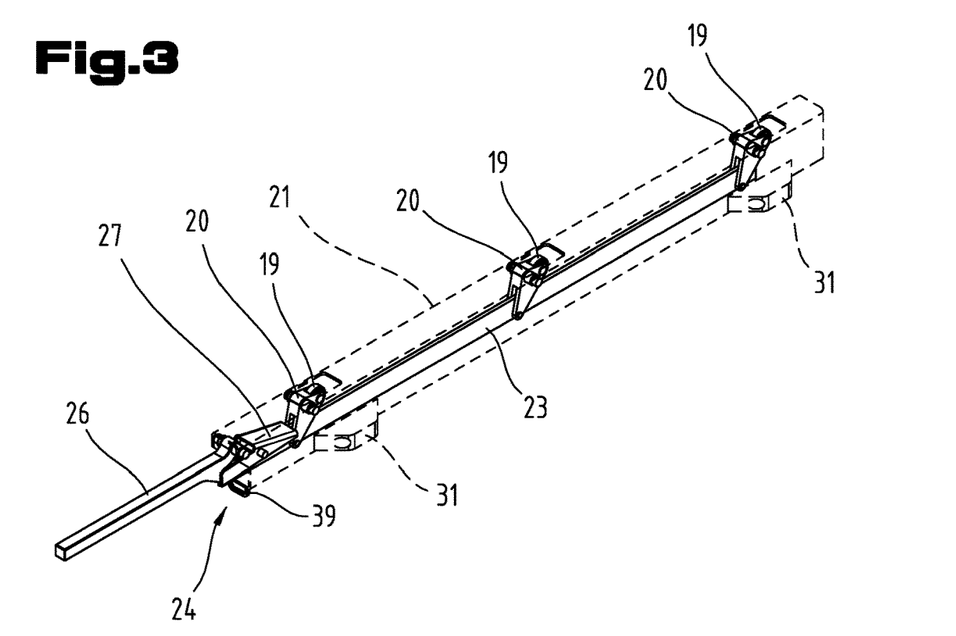
FIG. 3 an oblique view of an exemplary embodiment of a lifting tool.

FIG. 3 shows a schematic depiction of a lifting tool 7. The lifting tool 7 has an elongated profile body 21. The profile body 21 is preferably configured as a hollow body or also as a hollow rectangular pipe, as is shown by way of example in FIGS. 1 and 3. Inside the profile body 21, adjustable rolling bodies 19 are formed in at least the vertical direction 12. The rolling bodies 19 are connected to a lever device 20 for the adjustment from the rest position 13 into the service position 14. In the embodiment shown here, all lever devices 20 are connected to a push rod 23 via one lever arm 22 each. To illustrate the components arranged inside, the profile body 21 is shown in dashed lines. In this regard, the push rod 23 is configured so as to be displaceable in the longitudinal direction 10.

The lever devices 20 can be actuated, e.g. By means of an extension 26, as is shown in FIG. 3 and FIG. 4a,b. In this process, the adjusting force 33 is applied to the push rod 23 on the front side 24. Furthermore, FIG. 3 shows two guide bodies 31 in dashed lines. These guide bodies 31 can be arranged both in the transverse direction 11 laterally and/or on an underside of the lifting tool 7. They allow a weight reduction of the lifting tool 7. The guide bodies 31 favors a correct positioning of the lifting tool 7 when inserted into the carrier element 6. Furthermore, an insertion stop 39, which is formed on the underside of the lifting tool 7 on the front side 24, can be seen in FIG. 3. This simple measure allows correctly positioning the rolling bodies 19 opposite the corresponding passages 18 of the carrier element 6.

Figure 4:
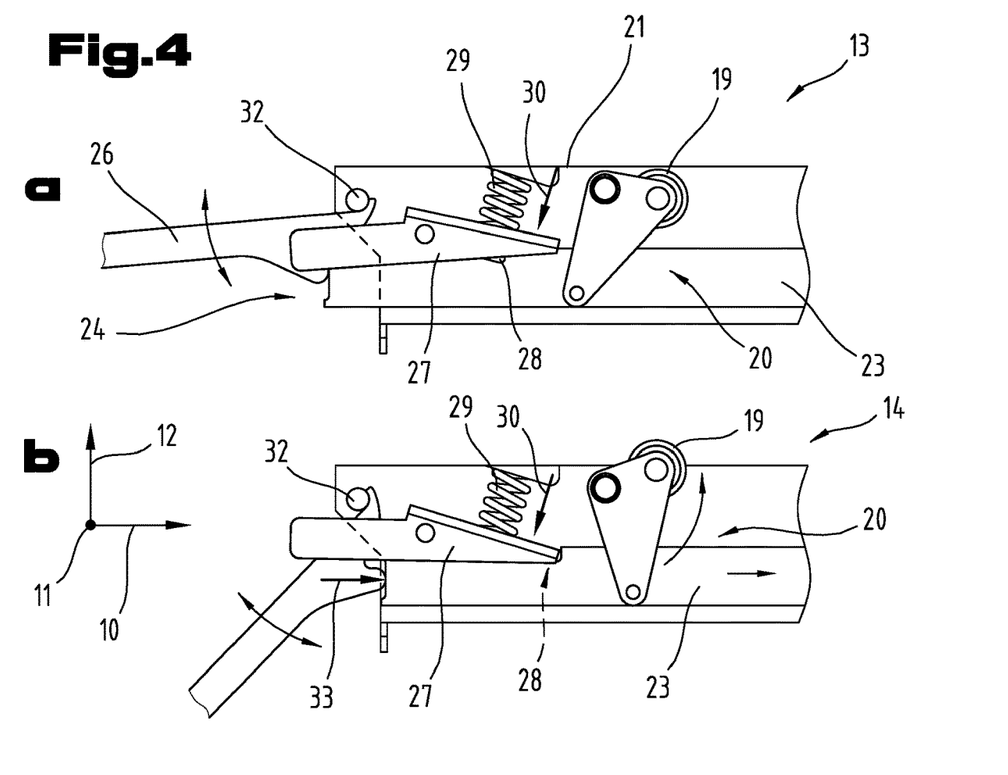
FIG. 4 a schematic sectional view through a part of an exemplary lifting tool with an extension in the rest position (a) and the service position (b)
Figure 5A:
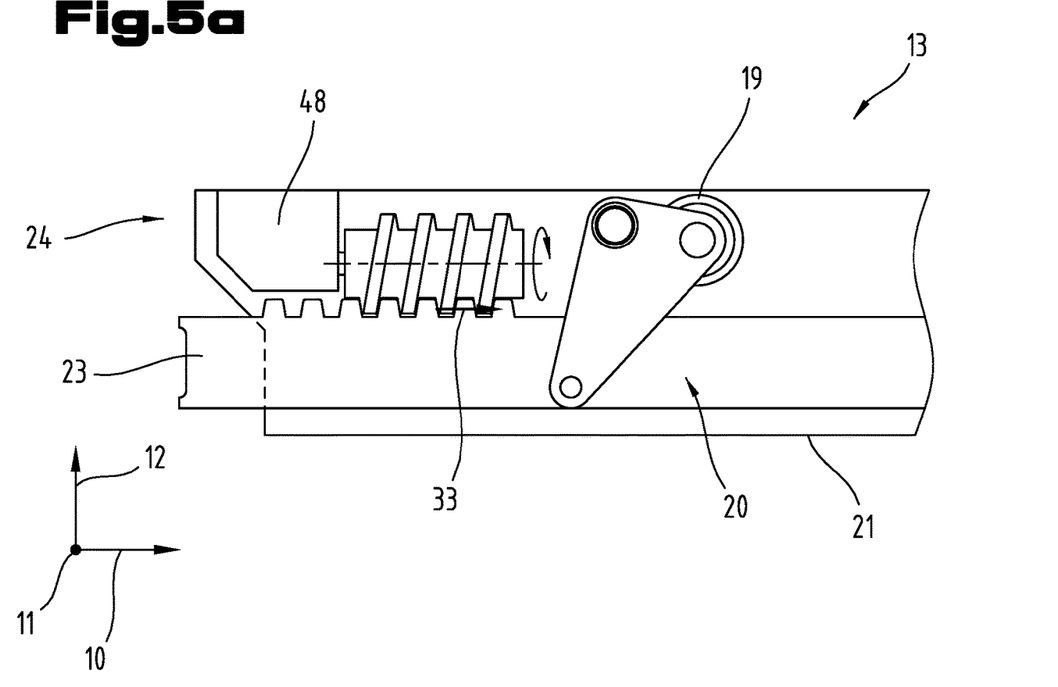
FIG. 5 a schematic sectional view through a part of an exemplary lifting tool with a motorized drive in the rest position (a) and the service position (b)
Figure 5B:
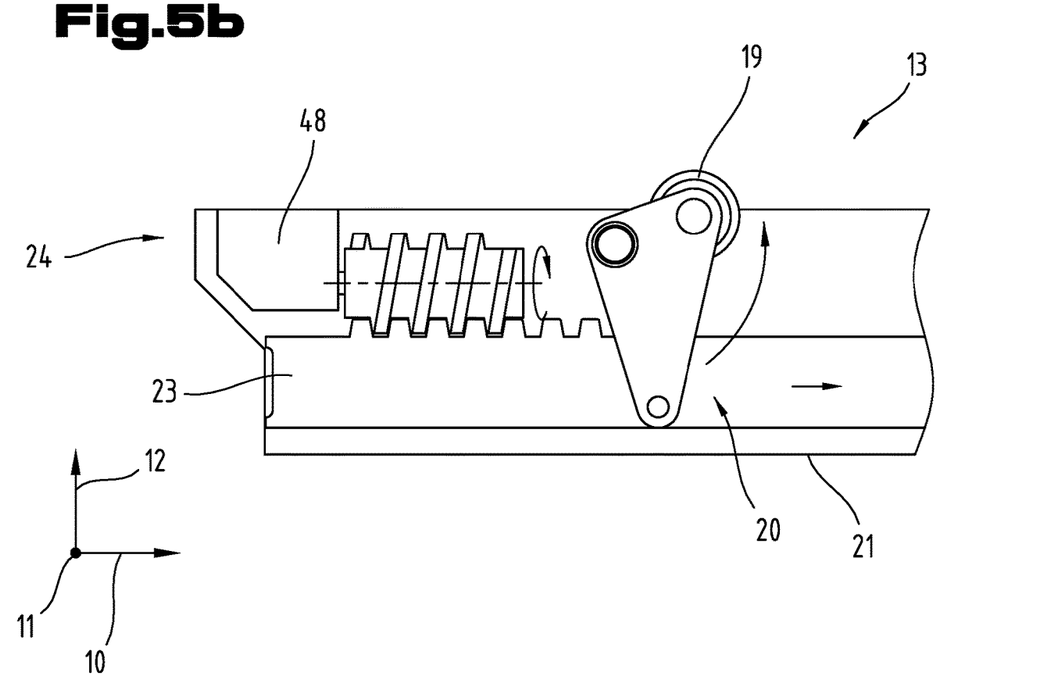

The lifting tool 7 therefore has to be inserted into the carrier elements 6 only when the power module 4 is changed. For illustrating the functional principle upon raising the power module 4, a cutout of the lifting tool 7 in the rest position 13 as well as in the service position 14 is schematically depicted in FIG. 4 and FIG. 5. In the rest position 13, FIG. 4a and FIG. 5a, the rolling bodies 19 are hidden in the profile body 21. When adjusting from the rest position 13 into the service position 14, FIGS. 4b and 5b, the rolling bodies 19 are deflected by the lever devices 20 such that they protrude through the passages 18 of the carrier elements 6.

In doing so, the power module 4 is raised to the service position 14 and can be transferred from the rack to a transfer device, not depicted, by a movement in the longitudinal direction 10.

The lifting tool shown in FIG. 4a and FIG. 5a has a push rod 23 which is connected to all of the lever devices 20. Therefore, when applying the adjusting force 33, all rolling bodies 19 of the lifting tool 7 are brought into the service position 14 simultaneously. As it can be seen in FIGS. 4a and 4b, the adjusting force 33 can be applied by a couplable extension 26. Such an extension 26 can be supported by means of a lever axle 32 on the lifting tool 7. It is equally conceivable to, instead of a bolt, as can be seen in FIGS. 4a and 4b, configure the lever axle (32), for example, as a hole or an alternative embodiment of a counter bearing for applying the leverage.

A further possibility for applying the adjusting force 33 is shown in FIGS. 5a and 5b, wherein a motorized drive unit 48 is depicted, by way of example, inside the profile body 21 of the lifting tool 7. The motorized drive unit 48 is preferably configured to be electromotive and is operatively connected to the push rod 23. This can, as shown in FIG. 5, happen via a spindle, wherein a force-fit and/or positive locking connection via a gear or the like is equally conceivable. Upon starting the preferably electromotive drive unit 48, the adjusting force 33 is transferred to the push rod such that an adjustment in the longitudinal direction 10 is carried out, wherein this process is reversible. As shown in FIG. 5, the drive unit 48 48 is preferably arranged on the front side 24 of the lifting tool 7, however, it can also be arranged so as to be hidden inside the profile body 21, in order to achieve, e.g. an improved weight balance of the lifting tool 7. The adjustment from the rest position 13 into the service position 14, see FIGS. 5a and 5b, is carried out analogously to the description of FIG. 4.

In order to ensure the lever devices 20 and/or the rolling bodies 19 being fixed in the service position 14, it has proven advantageous to arrange a locking device 27 in the lifting tool 7. In this regard, the locking device 27 is configured such that it automatically engages with a recess 28 when the push rod 23 is moved in the longitudinal direction 10. A suitable selection of the weight ratios on the locking device 27 allows for an automatic locking to ensue in a gravity-induced manner. Likewise, it is possible to apply a prestressing force 30 to the locking device 27 by means of, for example, a spring element 29. Such a locking device 27 is schematically depicted in FIG. 4 and can also be analogously transferred to the embodiment shown in FIG. 5.

Furthermore, e.g. FIG. 4 shows that the lifting tool 7 has a clearance on the front side 24, in the longitudinal direction 10 relative to the underside of the lifting tool 7. This makes it possible for the extension 26 to be entirely folded away and down in the vertical direction and therefore is not in the way of a transfer device.

An extension 26 can be connected to the lifting tool 7 so as to be rotatable about a pivot point just as fixed as for example the lever axle 32. Such an embodiment is shown in FIG. 3. Among other things, this contributes to securing the extension 26 against loss. The functional principle described above elucidates to the person skilled in the art that the suitable selection of the transmission requires only a light pressure exerted by the machine operator for actuating the lever device 20.

Figure 6A:
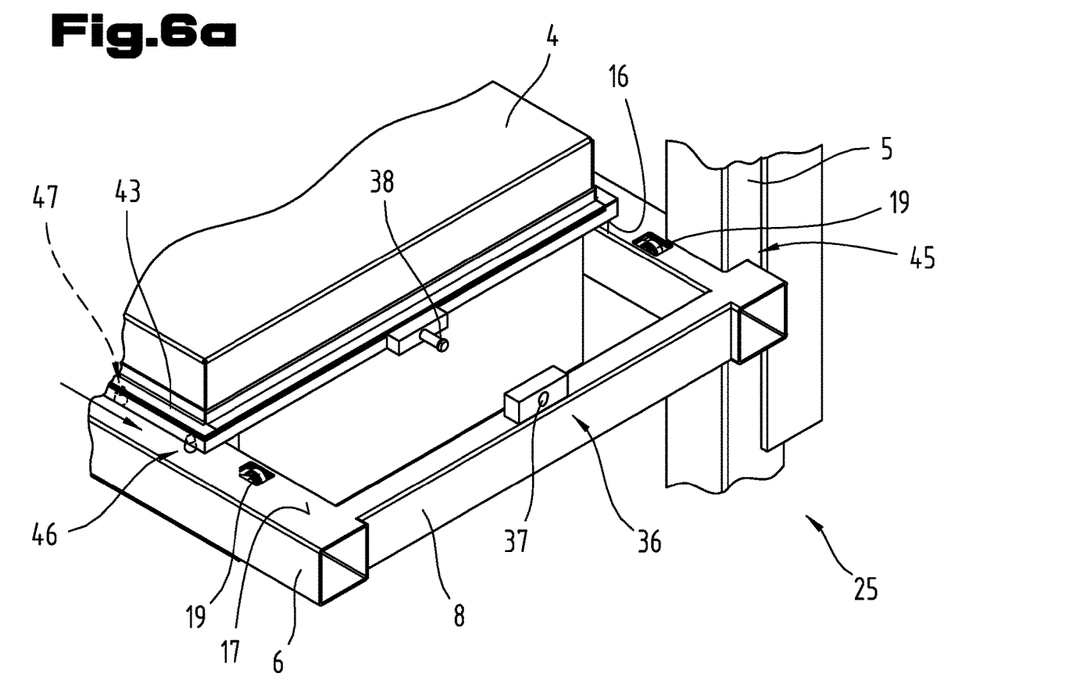
FIG. 6 an oblique view of an exemplary embodiment of a modular holding and exchanging system with a coupling device (a) and the principle of the arresting function (b)
Figure 6B:
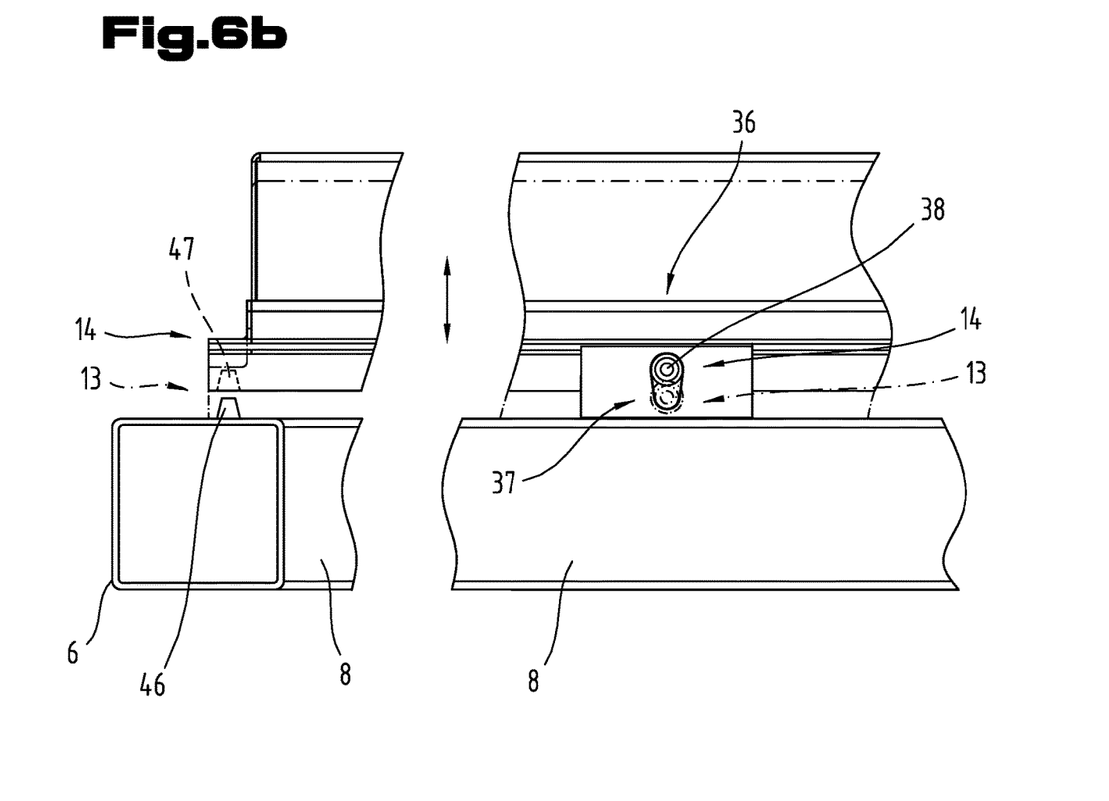

FIG. 6 shows a schematic representation of an exemplary embodiment which provides a coupling device 36 on the rack 2. The coupling device 36 can, for example, be configured as a lug or a receiving block with a receiving opening 37. The receiving opening 37 is configured such that a retaining element 38 of the power module 4 can be received in the receiving space 3 upon insertion of the power module 4. The retaining element 38 is preferably configured as a taper pin or a centering pin, which ensures a centering of the power module 4 in the transverse direction 11. In this respect, the retaining element 38 can be configured as a pin or bolt having a taper in the transverse direction 11, which, in the service position 14, meaning in a raised state of the power module 1, is connected to the coupling device 36 upon insertion into the rack 2. The pin or bolt preferably has a groove and/or a head that is widened with respect to the pin diameter, which head, upon lowering, is arrested from below by means of the coupling device 36 on at least one side in the vertical direction 12. In FIG. 6a, the cooperation of the retaining element 38 and the coupling device 36 during insertion in the service position 14 can be seen. Likewise, FIG. 6a shows that the formation of the support surface 16 of the power module is preferably formed on the cooling device 43. The coupling device 36 can be used simultaneously as an end stop in the longitudinal direction 10. FIG. 6b shows the principle of arresting the power module 4 by means of the coupling device 36. The continuous line of the retaining element 38 adumbrates the state in the service position 14.

The retaining element 38 preferably passes through the receiving opening 37 in the longitudinal direction. A retaining element 38 formed as a taper pin or bolt having a groove and/or a head therefore offers the advantage that the coupling device 36 is arrested upon lowering into the rest position 13. This is adumbrated in FIG. 6b by the dashed line used to represent the retaining element 38 in the rest position 13.

FIGS. 6a and 6b show exemplary arrangements of the arresting elevations 46 on the upper side of the carrier element 6. The engagement openings 47 on the support surface 16 of the cooling device 43 that are substantially complementary in terms of shape are shown in dashed lines and serve for receiving the arresting elevations 46 in the rest position 13. The mirror-inverted arrangement of arresting elevations 46 on the support surface 16 of the cooling device 43 and their engagement openings 47 on the carrier element 6, which are complementary in form and function, are not shown for reasons of clarity.

Moreover, it can be seen particularly well in FIG. 6a that each of the vertical standing elements 5 can have a plurality of lateral notches 45 for at least partially receiving the carrier elements 6 and/or the transverse elements 8.

Figure 7A:
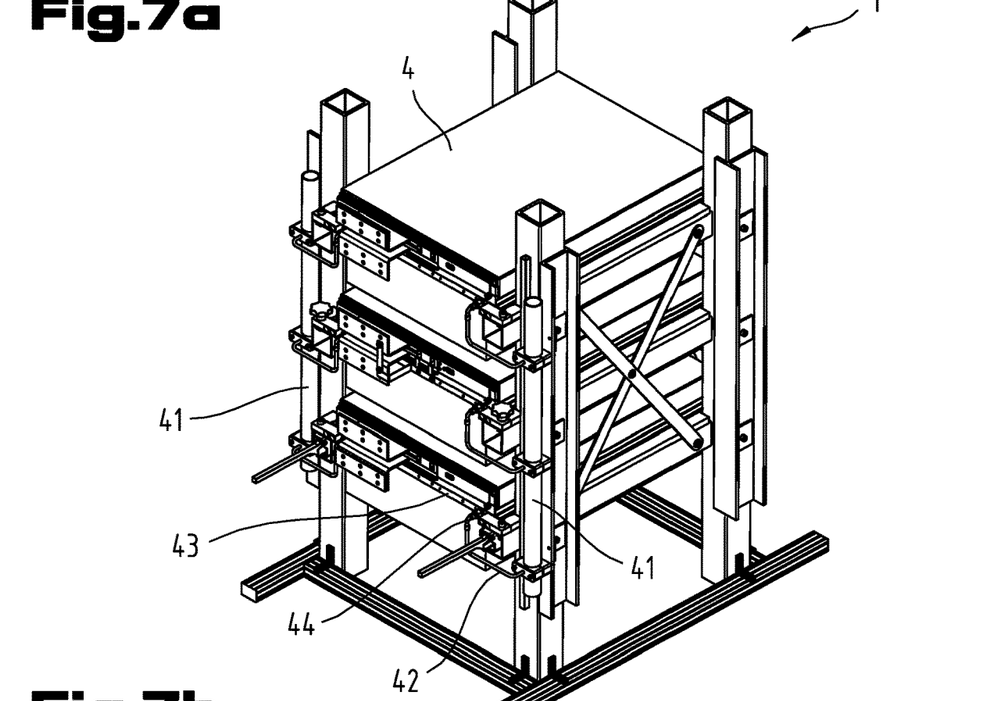
FIG. 7 an exemplary embodiment of a modular holding and exchanging system with three power modules and connection to the coolant supply line (a) as well as a detail of an exemplary connection for coolants (b).
Figure 7B:
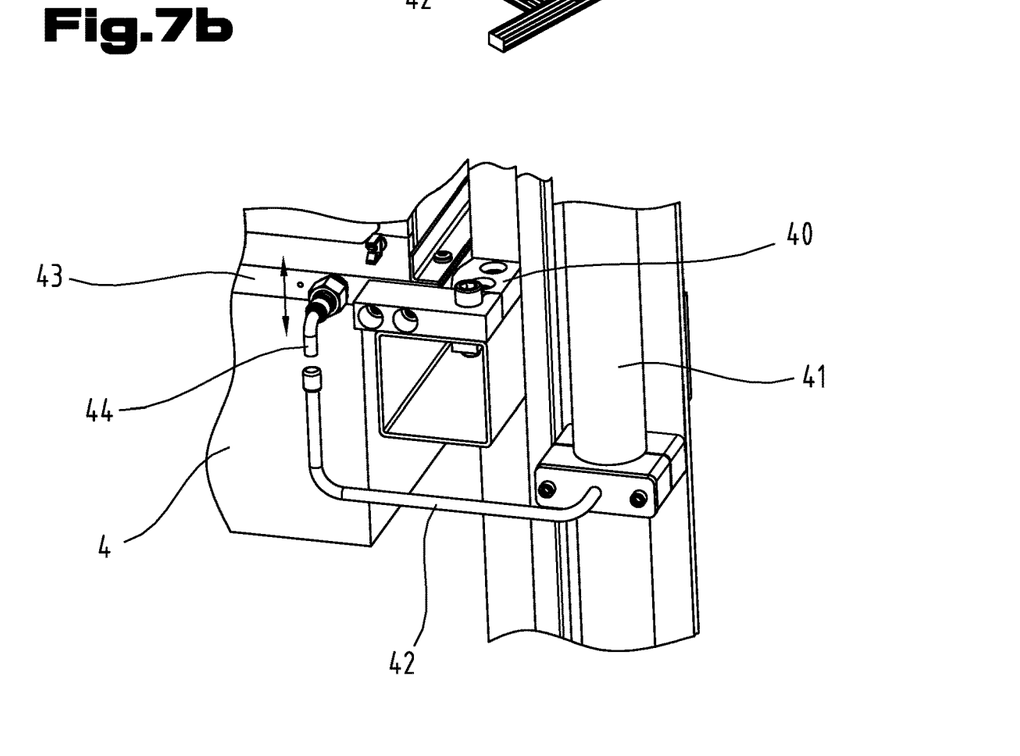

In FIG. 7, a further and possibly independent embodiment of the modular exchanging system can be seen. Again, equal parts are provided with equal reference numbers and include the preceding description with reference to FIGS. 1 to 6. FIG. 7a shows a schematic representation of three power modules 4, which are connected, via the power module connections 44, to the supply connections 42 leading to the coolant supply line 41. The schematic representation in FIG. 7a illustrates the principle that power modules 4 can be automatically connected to the coolant supply line 41 after a change. Alternatively to this form of representation, the formation of supply hoses is conceivable. When lowering the power module 4 into the rest position 13, the power module connections 44 can be coupled with the corresponding supply connections 42, as can be seen particularly well in FIG. 7b. In one embodiment, the power module connections 44 are configured so as to be bent downwards in the vertical direction such that an automatic coupling with the corresponding supply line 42 can take place.

Furthermore, a stop element can be seen in FIG. 7b which is formed so as to project in the transverse direction 11 on the cooling device 43. When inserting the power module 4 into the rack 2, the stop element of the cooling device 43 contacts the reference stop 40 in the longitudinal direction 10. This simple measure can be used for correctly positioning the power module 4 before lowering it into the rest position 13. Such a reference stop 40 ca be affixed on at least one side on the respective carrier element 6 and/or vertical standing element 5.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the teaching for technical action provided by the present invention lies within the ability of the person skilled in the art in this technical field.

The scope of protection is determined by the claims. However, the description and the drawings are to be adduced for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10. Finally, as a matter of form, it should be noted that for ease of understanding of the structure, elements are partially not depicted to scale and/or are enlarged and/or are reduced in size.

The invention claimed is:

1. A modular holding and exchanging system for a medium or high voltage converter, comprising:
   a rack for receiving at least two power modules arranged on top of one another in receiving spaces, wherein the rack has at least two pairs of vertical standing elements and at least two carrier elements connecting the vertical standing elements in a longitudinal direction of the rack in a horizontal support plane,
   a separately built lifting tool that can be coupled with the rack, which lifting tool comprises a longitudinally extended profile body and one or more rolling bodies, which one or more rolling bodies are arranged at the longitudinally extended profile body, and which one or more rolling bodies can be adjusted in relation to the longitudinally extended profile body between a rest position and a support and service position for temporarily raising and moving a power module relative to the carrier elements of the rack, wherein
   the power modules have support surfaces projecting in a transverse direction with respect to a housing width for being supported on the carrier elements, and
   the carrier elements have an upper side provided for at least parts of the support surface of the respective power module to rest on, and are configured as a profile element such that every carrier element has at least one passage for at least one rolling body to pass through in the support and service position of the lifting tool,
   and wherein the lifting tool is configured so as to be insertable into the profile element of the carrier element in the position of the lifting tool, and includes a lever device operable to adjust at least one of the rolling bodies from the rest position into the support and service position.

2. The modular holding and exchanging system according to claim 1, wherein the lifting tool includes two or more rolling bodies spaced apart from one another in the longitudinal direction, and the lever device comprises a push rod connected to all rolling bodies arranged in the longitudinal direction via one lever arm each, so as to be movable with respect to the profile body, for the simultaneous adjustment from the rest position into the support and service position.

3. The modular holding and exchanging system according to claim 2, wherein the lifting tool has a locking device for temporarily blocking the push rod in the support and service position by engaging with a recess on the push rod.

4. The modular holding and exchanging system according to claim 3, wherein the locking device has, for automatically locking upon adjustment of the lever device from the rest position into the support and service position, a spring element for applying a prestressing force between the profile body and the push rod, or is mounted in the profile body such that the automatic locking can take place in a gravity-induced manner.

5. The modular holding and exchanging system according to claim 2, wherein the lifting tool has a motorized drive unit on or inside the profile body, for adjusting the push rod in the longitudinal direction.

6. The modular holding and exchanging system according to claim 1, wherein the lever device is configured so as to be actuatable from a front side of the lifting tool in the longitudinal direction.

7. The modular holding and exchanging system according to claim 1, wherein on the profile body of the lifting tool, at least one guide body is arranged laterally and/or on an underside of the lifting tool.

8. The modular holding and exchanging system according to claim 1, wherein the lifting tool has a lever axle for amplifying the torque of an adjusting force applicable to the lever device in a longitudinal direction by means of a couplable extension.

9. The modular holding and exchanging system according to claim 8, wherein, on the lever axle, the exchanging system is connected to the lifting tool so as to be movable.

10. The modular holding and exchanging system according to claim 1, wherein at least one horizontally oriented transverse element is arranged on the rack in the longitudinal direction on a rear side of the rack for forming, together with the carrier elements adjacent thereto on both sides, a single-piece frame that is open on its front side.

11. The modular holding and exchanging system according to claim 1, wherein at least one of the carrier elements has at least one arresting elevation for securing the power module against shifting in the longitudinal and/or transverse direction, which is formed to be protruding in the vertical direction beyond the support plane for engaging with a corresponding engagement opening on a cooling device of the respective power module, and/or the cooling device has at least one arresting elevation protruding in the vertical direction beyond the support plane for engaging with a corresponding engagement opening on at least one of the carrier elements.

12. The modular holding and exchanging system according to claim 1, wherein the vertical standing elements are made from an electrically non-conducting profile element, in particular a rectangular pipe.

13. The modular holding and exchanging system according to claim 1, wherein the vertical standing elements each have a plurality of lateral notches for at least partially receiving the carrier elements and/or the transverse elements.

14. The modular holding and exchanging system according to claim 1, wherein, for connecting at least two receiving spaces in the transverse direction, the rack has at least one electrically non-conducting brace on a side of the rack and/or on a rear side of the rack.

15. The modular holding and exchanging system according to claim 1, wherein the rack has one stiffening profile each that is electrically non-conducting, H- or T-shaped, arranged to partially encase the vertical standing elements between adjacently arranged vertical standing elements.

16. The modular holding and exchanging system according to claim 1, wherein at least one coupling device for temporarily securing the power module in the rest position is formed on or inside the transverse element, such that it has one receiving opening each for receiving a corresponding retaining element in the support and service position formed on a rear side of the power module.

17. The modular holding and exchanging system according to claim 1, wherein coolant supply lines are arranged on or inside the vertical standing elements and/or the carrier elements and have, on each receiving space, supply connections have a cooling device of the respective power module for connecting to power module connections.

18. The modular holding and exchanging system according to claim 17, wherein the supply connections and the corresponding power module connections are configured for automatically coupling when lowered into the rest position and/or for decoupling when raised into the support and service position.

19. A method for exchanging a power module of a medium or high voltage converter, comprising the steps of:
providing a rack configured for receiving at least two power modules of the medium or high voltage converter which can be arranged on top of one another, which rack has at least two pairs of vertical standing elements and at least two carrier elements connecting the vertical standing elements on a longitudinal direction of the rack in a horizontal support plane, and wherein every carrier element has an upper side provided for at least parts of a support surface of the respective power module to rest upon, and the carrier elements are configured as a profile element such that every carrier element has at least one passage for at least one rolling body of a lifting tool to pass through when in a support and service position;

providing a separately built lifting tool including a longitudinally extended profile body that is configured to be insertable into the profile element of the carrier element in a rest position, and in which profile body a lever device is formed for adjusting the at least one rolling body in relation to the profile body from the rest position into the support and service position, inserting, in the longitudinal direction, one lifting tool each in the two corresponding carrier elements for the power module to be exchanged to rest on laterally in the transverse direction until the rolling bodies are arranged so as to align with the passages of the carrier element, actuating the lever device of the lifting tool for adjusting the rolling body from the rest position into the support and service position, wherein the power module to be exchanged is raised, relative to the carrier elements of the rack, by the rolling bodies contacting on at least parts of the support surfaces projecting in the transverse direction relative to its housing width, horizontal moving out of the power module in the longitudinal direction onto a transfer device, after raising the power module to be exchanged.

20. The method according to claim 19, wherein after moving out the power module, it is replaced with an intact power module or repaired, and after which the intact power module is moved back in.

* * * * *